United States Patent
Lee et al.

(10) Patent No.: US 7,964,882 B2
(45) Date of Patent: Jun. 21, 2011

(54) NITRIDE SEMICONDUCTOR-BASED LIGHT EMITTING DEVICES

(75) Inventors: Kyu Seok Lee, Daejeon (KR); Sung Bum Bae, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 179 days.

(21) Appl. No.: 12/446,513

(22) PCT Filed: Oct. 2, 2007

(86) PCT No.: PCT/KR2007/004818
§ 371 (c)(1),
(2), (4) Date: Apr. 21, 2009

(87) PCT Pub. No.: WO2008/069422
PCT Pub. Date: Jun. 12, 2008

(65) Prior Publication Data
US 2010/0187494 A1 Jul. 29, 2010

(30) Foreign Application Priority Data

Dec. 4, 2006 (KR) .................. 10-2006-0121354
May 14, 2007 (KR) .................. 10-2007-0046618

(51) Int. Cl.
*H01L 33/00* (2010.01)

(52) U.S. Cl. ............... 257/94; 257/13; 257/14; 257/79; 257/103; 257/E33.023

(58) Field of Classification Search ............ 257/13–14, 257/79, 94, 103, E33.023, E33.005
See application file for complete search history.

(56) References Cited

U.S. PATENT DOCUMENTS

| 5,042,043 A | 8/1991 | Hatano et al. |
| 6,433,364 B2 | 8/2002 | Hosoba et al. |
| 7,357,367 B1 * | 4/2008 | Christensen ............ 251/30.05 |
| 2005/0116309 A1 * | 6/2005 | Ohyama et al. ............ 257/431 |

FOREIGN PATENT DOCUMENTS

| JP | 2005-183930 | 7/2005 |
| JP | 2005-276899 | 10/2005 |
| KR | 1994-0012684 | 6/1994 |
| KR | 1997-0026601 | 6/1997 |
| KR | 2004-0049744 | 6/2004 |
| KR | 2006-0006484 | 1/2006 |
| KR | 2006-0095689 | 9/2006 |

OTHER PUBLICATIONS

Ridley, B. K., "Polarization-induced electron populations", Applied Physics Letters, vol. 77, No. 7, pp. 990-992, Aug. 14, 2000.

* cited by examiner

*Primary Examiner* — Cuong Q Nguyen
*Assistant Examiner* — Trang Q Tran
(74) *Attorney, Agent, or Firm* — Rabin & Berdo, P.C.

(57) ABSTRACT

A nitride semiconductor-based light emitting device is provided. The nitride semiconductor-based light emitting device is formed of a nitride semiconductor having a wurtzite lattice structure with the Ga face. The device has a substrate, a buffer layer, a first p-type contact layer, a second p-type contact layer, a first hole diffusion layer, a second hole diffusion layer, a light emitting active region, a second electron diffusion layer, a first electron diffusion layer, a second n-type contact layer and a first n-type contact layer, which are sequentially stacked. Such a structure may effectively employ quasi-two-dimensional free electron and free hole gases formed at heterojunction interfaces due to the spontaneous polarization and the piezoelectric polarization in the wurtzite lattice structure with the Ga face, and thus enhances the emission uniformity and emission efficiency of the light emitting device.

17 Claims, 2 Drawing Sheets

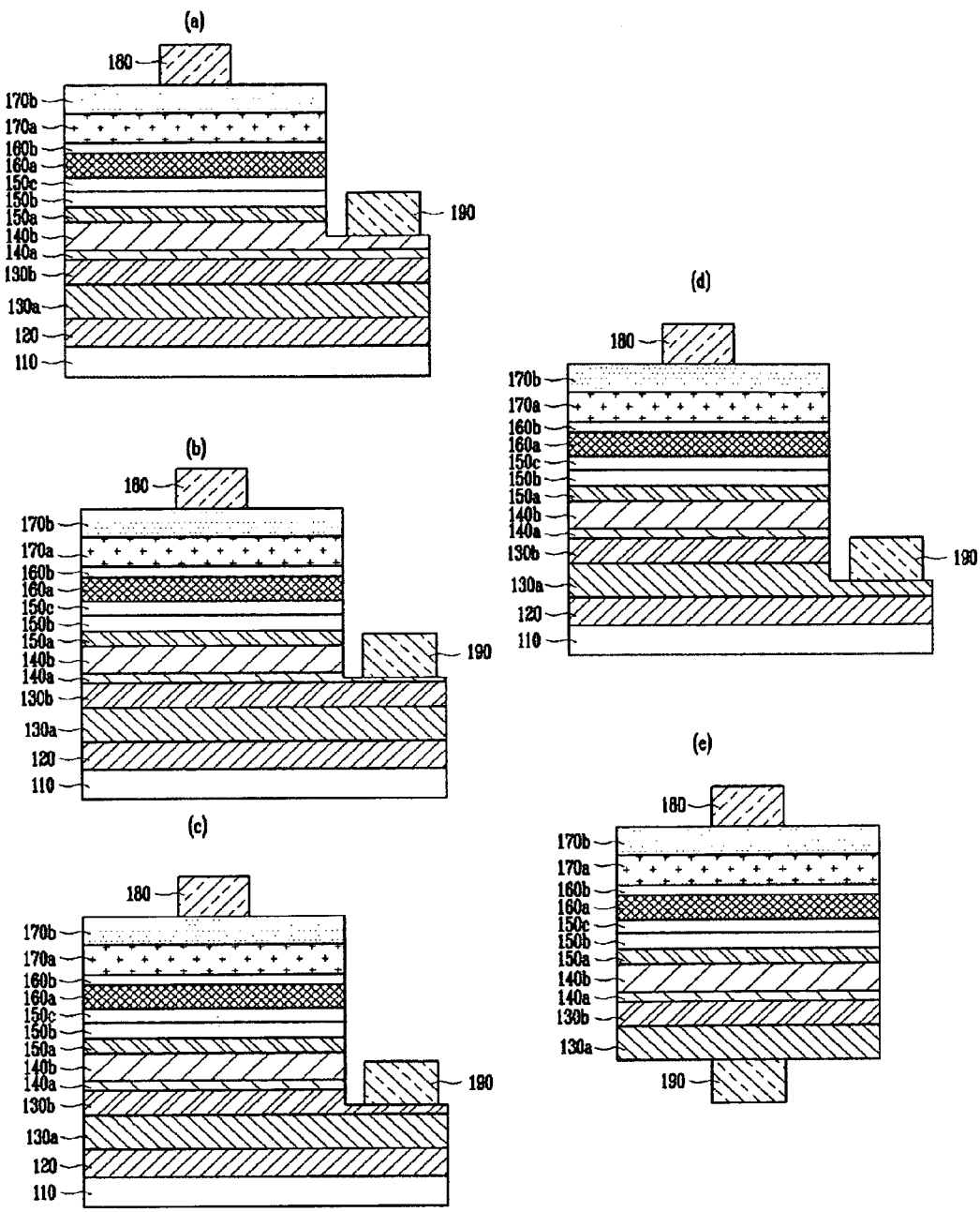
[Fig. 1]

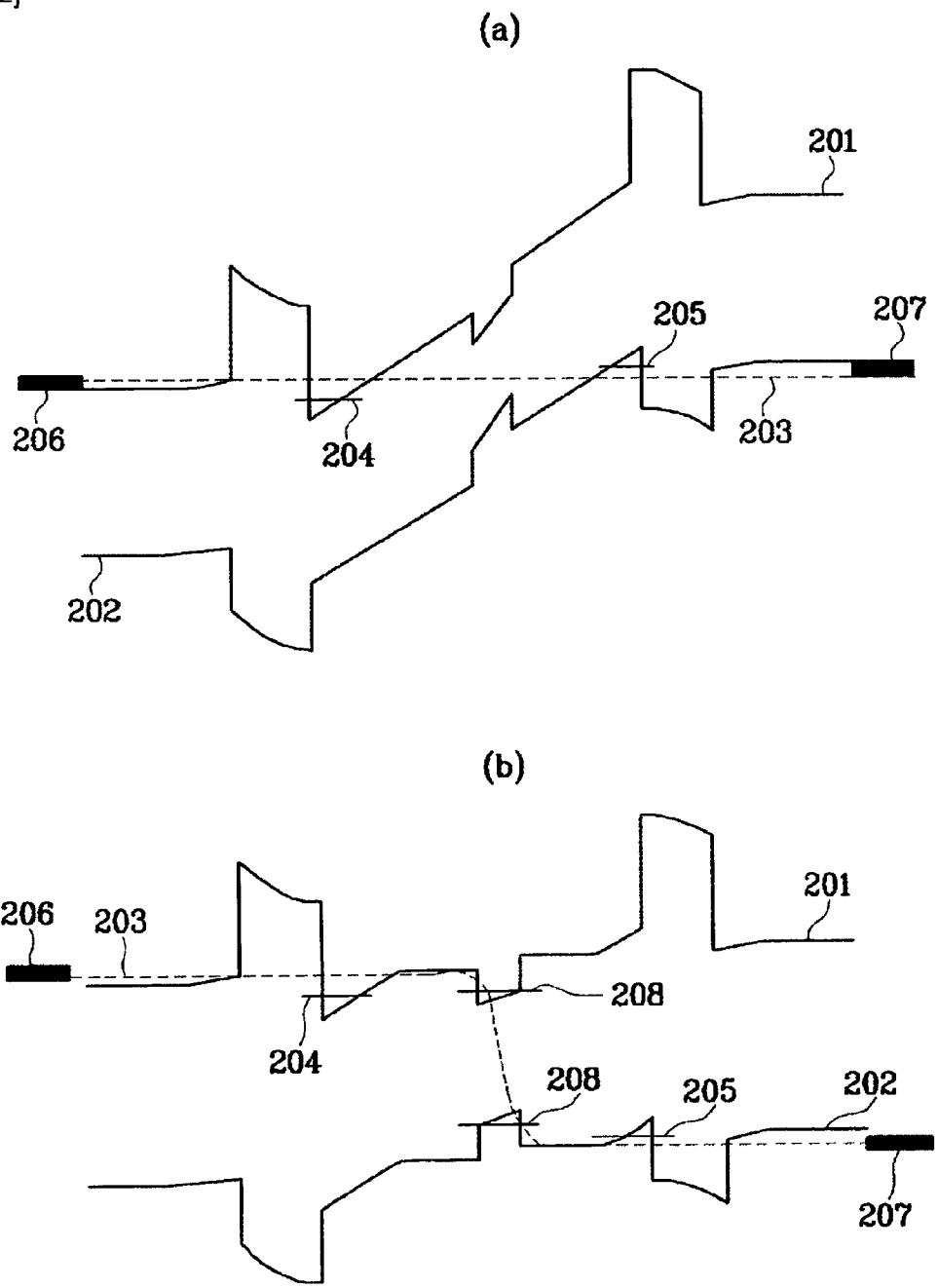
[Fig. 2]

NITRIDE SEMICONDUCTOR-BASED LIGHT EMITTING DEVICES

TECHNICAL FIELD

The present invention relates to nitride semiconductor-based light emitting devices, and more particularly, to nitride semiconductor-based light emitting devices having structures which can effectively use quasi-two-dimensional free electron and hole gases generated at heterojunction interfaces due to spontaneous and piezoelectric polarizations which commonly occur at the Ga-face interface of wurtzite lattice structures.

BACKGROUND ART

Nitride semiconductors (Al, In, Ga)N have bandgap energies ranging from about 0.7 eV to 6.2 eV according to their composition ratios. Heterojunction structures composed of these materials have been widely applied to light emitting devices emitting light in the visible and ultra-violet region.

The conventional technology in this field has generally employed an n-i-p structure which is formed on a substrate by sequentially growing an n-type semiconductor doped with donors, an intentionally undoped i-type active layer, and a p-type semiconductor doped with acceptors.

There are several important requirements for a semiconductor-based light emitting device to have a high efficiency. However, it is essential that an electron provided from the n-type electrode and a hole provided from the p-type electrode are evenly diffused in the n-type semiconductor and the p-type semiconductor, respectively, and then recombined in the active layer between these layers by means of the optical transition.

Since holes in most nitride semiconductors have a lower mobility than electrons, it is important that the diffusivity of hole in the p-type nitride semiconductor be increased in order to improve the emission characteristic of a nitride semiconductor-based light emitting device. The diffusivity of hole in the p-type nitride semiconductor depends on several factors such as the concentration of holes, the effective mass of hole, and the concentration of impurities serving as scattering centers of the hole, etc.

Conventionally, to increase the diffusivity of hole in p-type nitride semiconductors, a method of increasing the hole concentration in the p-type nitride semiconductor has been used. GaN generally becomes a p-type semiconductor when it is doped with magnesium atoms and then annealed, thereby converting magnesium impurities into acceptors and releasing free holes. The maximum concentration of holes commonly obtained by this method is approximately $5 \times 10^{17}$ cm$^{-3}$.

On the other hand, an n-type GaN may be formed by doping silicon atoms serving as donors, and the concentration of free electrons routinely obtained by this method is approximately $1 \times 10^{18}$ cm$^{-3}$. Because there is a large difference between electron and hole concentrations usually achieved in the n- and p-type GaN semiconductors, respectively, a novel structure that increases the concentration and mobility of hole is needed to realize a light-emitting device having a higher efficiency than the current level.

The present inventors discovered that carrier diffusion and current spreading can effectively be achieved and used to enhance the emission efficiency of nitride semi-conductor-based light emitting devices consisting of an n-type semiconductor grown on the substrate followed sequentially by an i-type semiconductor and a p-type semi-conductor. This structure has the wurtzite lattice structure with the Ga face, and the spontaneous and piezoelectric polarizations in the n-i-p hetero-structure assist the accumulation of free electrons and holes at the n-i interface and the i-p interface, respectively. This effect gives rise to carrier diffusion and current spreading at the hetero-interfaces.

DISCLOSURE OF INVENTION

Technical Problem

The present invention is directed to a nitride semiconductor-based light emitting device having an emitting structure which can effectively employ quasi-two-dimensional free electron and hole gases formed at heterojunction interfaces due to spontaneous the polarization and piezoelectric polarizations commonly occurring in a wurtzite lattice structure with the Ga face, and thus enhance the emission uniformity and emission efficiency of the device.

Technical Solution

One aspect of the present invention provides a nitride semiconductor-based light emitting device having a wurtzite lattice structure with the Ga face, comprising: a substrate; a buffer layer formed on the substrate; a first p-type contact layer formed on the buffer layer; a second p-type contact layer formed on the first p-type contact layer; a first hole diffusion layer formed on the second p-type contact layer; a second hole diffusion layer formed on the first hole diffusion layer; a light emitting active region formed on the second hole diffusion layer; a second electron diffusion layer formed on the light emitting active region; a first electron diffusion layer formed on the second electron diffusion layer; a second n-type contact layer formed on the first electron diffusion layer; and a first n-type contact layer formed on the second n-type contact layer.

In the nitride semiconductor-based light emitting device according to the present invention, the second p-type contact layer may be formed of $Al_xGa_{1-x}N$ ($0.1 \leq x \leq 0.5$) doped with magnesium atoms at a concentration of $1 \times 10^{18}$ cm$^{-3}$ or more, and the first hole diffusion layer may be formed of intentionally p-doped or undoped $In_yGa_{1-y}N$ ($0 \leq y \leq 0.05$), wherein the intentionally p-doped layer may be doped with magnesium atoms at a concentration of $1 \times 10^{18}$ cm$^{-3}$ or less.

Also, in the nitride semiconductor-based light emitting device according to the present invention, the first electron diffusion layer may be formed of $In_yGa_{1-y}N$ (y is within a growth technology error range of an indium composition of the second hole diffusion layer) which may be intentionally n-doped or undoped, wherein the intentionally n-doped layer may be doped with silicon atoms at a concentration of $1 \times 10^{18}$ cm$^{-3}$ or less, and the second n-type contact layer may be formed of $Al_xGa_{1-x}N$ (x is within a growth technology error range of an aluminum composition of the second p-type contact layer) which may be doped with silicon atoms at a concentration of $1 \times 10^{18}$ cm$^{-3}$ or more.

Advantageous Effects

A nitride semiconductor-based light emitting device according to the present invention has a light emitting structure which effectively uses quasi-two-dimensional free electron and hole gases formed at a heterojunction interface due to the spontaneous polarization and the piezoelectric polarization, both of which commonly occur in a wurtzite lattice structure with the Ga face. This structure enables electrons and holes injected through electrodes to be diffused with high mobility in each diffusion layer and on a plane perpendicular to the growth axis, thereby enhancing the emission uniformity and the emission efficiency in the light emitting device.

A structure of nitride semiconductor-based light emitting devices according to the present invention has a first hole diffusion layer and a first electron diffusion layer, where quasi-two-dimensional free hole and electron gases are accumulated, adjacent to a light emitting active region. Thus, this structure may increase emission efficiency by easily providing charges to a light emitting active region through second hole and electron diffusion layers by means of a forwardly applied external voltage for emission operation.

A nitride semiconductor-based light emitting device according to the present invention has a first hole diffusion layer normally having a quasi-two-dimensional free hole gas and a first electron diffusion layer normally having a quasi-two-dimensional free electron gas, which are adjacent to the light emitting active region. Thus, this structure may increase emission efficiency by reducing the non-radiative transition that occurs after passing through the first hole diffusion layer.

BRIEF DESCRIPTION OF THE DRAWINGS

FIG. 1A is a cross-sectional view of a structure of nitride semiconductor-based light emitting devices according to the first exemplary embodiment of the present invention;

FIG. 1B is a cross-sectional view of a structure of nitride semiconductor-based light emitting devices having a p-type metal differently located from FIG. 1A;

FIG. 1C is a cross-sectional view of a structure of nitride semiconductor-based light emitting devices having a p-type metal differently located from FIG. 1A;

FIG. 1D is a cross-sectional view of a structure of nitride semiconductor-based light emitting device having a p-type metal differently located from FIG. 1A;

FIG. 1E is a cross-sectional view of a structure of nitride semiconductor-based light emitting devices having a p-type metal differently located from FIG. 1A;

FIG. 2A schematically illustrates the conduction- and valence-band structure when an external voltage is not applied to the nitride semiconductor-based light emitting device according to embodiments of FIGS. 1A to 1E; and FIG. 2B schematically illustrates the conduction- and valence-band structure when an external voltage is forwardly applied for the emission operation to the nitride semiconductor-based light emitting device according to embodiments of FIGS. 1A to 1E.

DESCRIPTION OF MAJOR SYMBOLS IN THE ABOVE FIGURES

110: Substrate
120: Undoped GaN buffer
130a: First p-type contact layer
130b: Second p-type contact layer
140a: First hole diffusion layer
140b: Second hole diffusion layer
150a: First barrier layer
150b: Quantum well layer
150c: Second barrier layer 160a: Second electron diffusion layer
160b: First electron diffusion layer
170a: Second n-type contact layer
170b: First n-type contact layer
180: N-type metal electrode
190: p-type metal electrode 201: Conduction-band edge of the light emitting device
202: Valence-band edge of the light emitting device
203: Fermi energy level
204: Subband energy level of the quasi-two-dimensional electron gas formed in the first electron diffusion layer 160b
205: Subband energy level of the quasi-two-dimensional hole gas formed in the first hole diffusion layer 140a
206: Fermi energy level of the n-type metal electrode
207: Fermi energy level of the p-type metal electrode
208: Subband energy level of electrons bound in the quantum well layer 150b
209: Subband energy level of holes bound in the quantum well layer 150b

MODE FOR THE INVENTION

Hereinafter, exemplary embodiments of the present invention will be described in detail. However, the present invention is not limited to the exemplary embodiments disclosed below, but can be implemented in various types. Therefore, the present exemplary embodiments are provided for the complete disclosure of the present invention and to fully inform the scope of the present invention to those ordinarily skilled in the art.

FIG. 1A is a schematic cross-sectional view of a nitride semiconductor-based light emitting device according to an exemplary embodiment of the present invention using nitride semiconductors having wurtzite lattice structures with the Ga face.

Referring to FIG. 1A, in the nitride semiconductor-based light emitting device of the present invention, a substrate 110, a buffer layer 120, a first p-type contact layer 130a, a second p-type contact layer 130b, a first hole diffusion layer 140a, a second hole diffusion layer 140b, a first barrier layer 150a, a quantum well layer 150b, a second barrier layer 150c, a second electron diffusion layer 160a, a first electrode diffusion layer 160b, a second n-type contact layer 170a and a first n-type contact layer 170b are sequentially formed, an n-type metal electrode 180 is disposed on the n-type contact layer, and a p-type metal electrode 190 is in contact with the second hole diffusion layer 140b.

Each layer will now be described in detail with reference to FIG. 1A.

The substrate 110 may be commonly formed of sapphire, silicon carbide (SiC) or GaN.

The undoped GaN buffer layer 120 may be grown on the substrate 110. The GaN buffer layer 120 may be grown to a thickness of 0.5 to 3 µm, and may be formed in a junction structure of a low-temperature-grown buffer layer having a low growth temperature and a high-temperature-grown buffer layer having a relatively high growth temperature, when the GaN buffer layer uses a substrate having a different lattice constant.

A first p-type contact layer 130a is grown on the GaN buffer layer 120.

The first p-type contact layer 130a may be grown to a thickness of 0.5 to 3 µm using GaN doped with magnesium atoms at a concentration of $1\times10^{18}$ cm$^{-3}$ or more, preferably $1\times10^{18}$ cm$^{-3}$ to $1\times10^{19}$ cm$^{-3}$.

A second p-type contact layer 130b is grown on the first p-type contact layer 130a.

The second p-type contact layer 130b may be grown to a thickness of 5 to 50 nm using a material having a composition of Al$_x$Ga$_{1-x}$N ($0.1 \leq x \leq 0.5$) doped with magnesium atoms at a concentration of $1\times10^{18}$ cm$^{-3}$ or more, preferably $1\times10^{18}$ cm$^{-3}$ to $1\times10^{19}$ cm$^{-3}$.

A first hole diffusion layer 140a is grown on the second p-type contact layer 130b.

The first hole diffusion layer 140a may be grown to a thickness of 0.1 to 20 nm using a material having a composition of $In_yGa_{1-y}N$ ($0 \leq y \leq 0.05$) which is intentionally p-doped or undoped. Also, when the first hole diffusion layer 140a is p-doped intentionally, it may be doped with magnesium at a concentration of $1 \times 10^{18}$ cm$^{-3}$ or less.

Then, a second hole diffusion layer 140b is grown on the first hole diffusion layer 140a.

The second hole diffusion layer 140b may be grown to a thickness of 5 to 100 nm using a material having a composition of $In_zGa_{1-z}N$ ($0 \leq z \leq 0.05$) which is doped with magnesium atoms at a concentration of $1 \times 10^{17}$ cm$^{-3}$ to $1 \times 10^{18}$ cm$^{-3}$.

A light emitting active region 150 is grown on the second hole diffusion layer 140b. The light emitting active region 150 may be grown to be divided into a first barrier layer 150a, a quantum well layer 150b and a second barrier layer 150c.

That is, the first barrier layer 150a is grown on the second hole diffusion layer 140b.

The first barrier layer 150a may be grown to a thickness of 5 to 20 nm using a material having a composition of $In_zGa_{1-z}N$, which is the same as that of the second hole diffusion layer 140b, and may be intentionally undoped or doped with magnesium atoms at a concentration of $1 \times 10^{17}$ cm$^{-3}$ or less.

The quantum well layer 150b is grown on the first barrier layer 150a.

The quantum well layer 150b is grown to a thickness of 0.5 to 10 nm, and formed of $In_xGa_{1-x}N$ which is intentionally undoped, but whose bandgap is smaller than that of the first barrier layer 150a. Thus, an indium composition x is limited in the range of $0.05 \leq x \leq 1.0$.

The second barrier layer 150c is grown on the quantum well layer 150b.

The second barrier layer 150c is grown using an $In_zGa_{1-z}N$ material having the same indium composition and thickness as the first barrier layer 150a. The second barrier layer 150c is intentionally undoped or doped with silicon atoms at a concentration of $1 \times 10^{17}$ cm$^{-3}$ or less.

Meanwhile, a light emitting active region may have 1 to 10 quantum wells, each of which is composed of the first barrier layer 150a, the quantum well layer 150b, and the second barrier layer 150c.

A second electron diffusion layer 160a is grown on the second barrier layer 150c.

The second electron diffusion layer 160a may be grown to a thickness of 5 to 100 nm using a material having a composition of $In_zGa_{1-z}N$ doped with silicon atoms at a concentration of $1 \times 10^{17}$ cm$^{-3}$ to $1 \times 10^{18}$ cm$^{-3}$. In addition, an indium composition z of the material of the second electron diffusion layer 160a is the same as that of the second hole diffusion layer 140b within an error range of growth technology.

A first electron diffusion layer 160b is grown on the second electron diffusion layer 160a.

The first electron diffusion layer 160b may be grown to a thickness of 0.1 to 20 nm using a material having a composition of $In_yGa_{1-y}N$ intentionally n-doped or undoped. And, the indium composition y is the same as that of the first hole diffusion layer 140a within the error range of growth technology. The first electron diffusion layer 160b is intentionally n-doped with silicon atoms at a concentration of $1 \times 10^{18}$ cm$^{-3}$ or less.

A second n-type contact layer 170a is grown on the first electron diffusion layer 160b.

The second n-type contact layer 170a may be grown to a thickness of 5 to 50 nm using a material having a composition of $Al_xGa_{1-x}N$ doped with silicon atoms at a concentration of $1 \times 10^{18}$ cm$^{-3}$ or more, preferably $1 \times 10^{18}$ cm to $1 \times 10^{19}$ cm$^{-3}$. The aluminum composition x of this material is the same as that of the second p-type contact layer 130b within the error range of growth technology.

A first n-type contact layer 170b is grown on the second n-type contact layer 170a.

The first n-type contact layer 170b may be grown to a thickness of 10 nm to 1 μm using GaN doped with silicon atoms at a concentration of $1 \times 10^{18}$ cm$^{-3}$ or more, preferably $1 \times 10^{18}$ cm$^{-3}$ to $1 \times 10^{19}$ cm$^{-3}$.

Meanwhile, the layers may be grown by a general method known in the art. However, the invention is not limited thereto.

A light emitting device according to the present invention having the structure as described above includes an n-type electrode 180 and a p-type electrode 190. The n-type electrode 180 may be in contact with the first n-type contact layer 170b, and the p-type electrode 190 may use any layer of the second hole diffusion layer 140a, the first hole diffusion layer 140b, the second p-type contact layer 130b and the first p-type contact layer 130a as a p-type electrode contact surface. Also, the p-type electrode may be in contact with a lower part of the first p-type contact layer 130a by removing a substrate and a GaN buffer layer. In the meantime, the structure grown for the p-type electrode contact is etched by a conventional etching method.

The structure of FIG. 1B is formed using the first hole diffusion layer 140a as a contact surface of the p-type electrode 190 in the structure of FIG. 1A. The structure of FIG. 1C is formed using the second p-type contact layer 130b as a contact surface of the p-type electrode 190 in the structure of FIG. 1A, and the structure of FIG. 1D is formed using a first p-type contact layer 130a as a contact surface of the p-type electrode 190 in the structure of FIG. 1A.

Meanwhile, the structure shown in FIG. 1E is formed by removing the substrate 110 and the GaN buffer layer 120 from the structure of FIG. 1A, and then contacting the p-type electrode 190 with the lower part of the first p-type contact layer 130a.

The conduction- and valence-band profile without and with an external voltage applied to the nitride semiconductor-based light emitting device having the structures of FIGS. 1A to 1E according to the present invention are illustrated in FIGS. 2A and 2B, respectively.

Referring to FIG. 2A, reference numbers 201 and 202 indicate edges of the conduction band and the valence band of the light emitting device according to the present invention, respectively, and reference number 203 indicates the Fermi energy level in emission. The Fermi level 203 must lie near the edge 202 of the valence band of the first p-type contact layer and the edge 201 of the conduction band of the first n-type contact layer, and the profile of the conduction and valence bands is determined according to the result. Meanwhile, reference numbers 206 and 207 denote Fermi energy levels of the n- and p-type metal electrodes, respectively. However, in the case of using a nitride semiconductor-based material having a wurtzite lattice structure with the Ga face, which is commonly used, when a material having a composition of $In_yGa_{1-y}N$ is grown on a material having a composition of $Al_xGa_{1-x}N$ used as a second p-type contact layer 130b, a triangle-shaped one-dimensional quantum well structure having subbands 205 having holes near the junction interface of these materials due to a difference in the piezoelectric polarization and the spontaneous polarization in the growth axis direction between these materials. The holes that occupy the subbands 205 of the quantum well become a quasi-two-dimensional free hole gas freely traveling on a plane perpendicular to the growth axis, wherein the mobility of the hole gas is drastically increased compared to holes in a bulk structure due to a relatively low scattering effect. Thus, the $In_yGa_{1-y}N$ layer grown on a second p-type contact layer 130b becomes the first hole diffusion layer 140a as it contributes to the diffusion of holes on the plane.

Meanwhile, in the case of using a nitride semiconductor-based material having a wurtzite lattice structure with the Ga face, which is commonly used, when a material having a composition of $Al_xGa_{1-x}N$ is grown on a material having a composition of $In_yGa_{1-y}N$, a triangle-shaped one-dimensional quantum well structure having subbands 204 having electrons around a junction interface of these materials is formed in a growth axis direction due to a difference in the piezoelectric polarization and the spontaneous polarization between these two materials. The electrons that occupy the subbands 204 of the quantum well becomes a quasi-two-dimensional free electron gas freely traveling on a plane perpendicular to the growth axis, wherein the mobility of the electron gas is drastically increased compared to electrons in the bulk structure due to a relatively low scattering effect. Thus, the $In_yGa_{1-y}N$ layer in contact with the second n-type contact layer 170a and grown prior to this layer becomes the first electron diffusion layer 160b, since the $In_yGa_{1-y}N$ layer contributes to the diffusion of the electron on the plane.

Referring to FIG. 2B, structures of the conduction band and the valence band when an external voltage is forwardly applied for the emission operation to the nitride semi-conductor-based light emitting device according to the embodiments of FIGS. 1A to 1E are illustrated. The structures illustrated in the embodiments of FIGS. 1A to 1E exhibit large changes in the Fermi energy level in a light emitting active region including a first barrier layer, a quantum well layer and a second barrier layer when an external voltage is forwardly applied. However, the Fermi energy level does not exhibit large changes in other regions, e.g., the first p-type contact layer, the second p-type contact layer, a first hole diffusion layer binding a quasi-two-dimensional free hole gas, a p-type second hole diffusion layer, an n-type second electron diffusion layer, a first electron diffusion layer binding a quasi-two-dimensional free electron gas, a second n-type contact layer, and a first n-type contact layer. This shows that densities of the quasi-two-dimensional charges bound in the first hole diffusion layer and the first electron diffusion layer are rather insensitive to the external voltage applied for the emission operation.

The emission operation of the light emitting device according to the present invention will now be described. The hole provided from the p-type electrode is diffused with high mobility on the plane perpendicular to the growth axis in the first hole diffusion layer, passes through the second hole diffusion layer, and flows into the light emitting active region. The electron provided from the n-type electrode is diffused with high mobility on a plane perpendicular to the growth axis in the first electron diffusion layer, passes through the second electron diffusion layer, and flows into the light emitting active region. Then, the hole and the electron are optically recombined in the light emitting active region, and thus emit light. Accordingly, the light emitting device structure of the present invention enhances the emission uniformity and emission efficiency of the device.

Meanwhile, a nitride semiconductor structure with the N-face may produce a similar result to the effect of the present invention by using a structure grown in a counter-direction to the embodiment of FIGS. 1A to 1E in the present invention, that is, a structure in which n-type contact layers are first grown, and light emitting active layers and p-type contact layers are sequentially grown.

Alternatively, a nitride semiconductor structure with the Ga face may not produce the same effect as that of the present invention by using the structure grown in the counter-direction to the embodiment of FIGS. 1A to 1E in the present invention, because the polarization characteristic on the heterojunction structure is different from that of the structure of the present invention.

While the invention has been shown and described with reference to certain exemplary embodiments thereof, it will be understood by those skilled in the art that various changes in form and details may be made therein without departing from the spirit and scope of the invention as defined by the appended claims.

The invention claimed is:

1. A nitride semiconductor-based light emitting device having a wurtzite lattice structure with the Ga face, comprising:
   a substrate;
   a buffer layer formed on the substrate;
   a first p-type contact layer formed on the buffer layer;
   a second p-type contact layer formed on the first p-type contact layer;
   a first hole diffusion layer formed on the second p-type contact layer;
   a second hole diffusion layer formed on the first hole diffusion layer;
   a light emitting active region formed on the second hole diffusion layer;
   a second electron diffusion layer formed on the light emitting active region;
   a first electron diffusion layer formed on the second electron diffusion layer;
   a second n-type contact layer formed on the first electron diffusion layer; and
   a first n-type contact layer formed on the second n-type contact layer wherein the second p-type contact layer is formed of a material having a composition of $Al_xGa_{1-x}N(0.1 \leq x \leq 0.5)$ doped with a magnesium atom at a concentration of $1 \times 10^{18}$ cm$^{-3}$ or more, and the first hole diffusion layer is formed of a material having a composition of $In_yGa_{1-y}N(0 \leq y \leq 0.05)$ which is intentionally p-doped or undoped, the intentionally p-doped layer being doped with magnesium atoms at a concentration of $1 \times 10^{18}$ cm$^{-3}$ or less.

2. The device according to claim 1, wherein the first electron diffusion layer is formed of a material having a composition of $In_yGa_{1-y}N$ (y is within a growth technology error range and an indium composition of the second hole diffusion layer) which is intentionally n-doped or undoped, the intentionally n-doped layer being doped with silicon atoms at a concentration of $1 \times 10^{18}$ cm$^{-3}$ or less, and the second n-type contact layer is formed of a material having a composition of $Al_xGa_{1-x}N$ (x is within a growth technology error range and an aluminum composition of the second p-type contact layer) which is doped with silicon atoms at a concentration of $1 \times 10^{18}$ cm$^{-3}$ or more.

3. The device according to claim 1, wherein the first p-type contact layer is formed to a thickness of 0.5 to 3 μm using a GaN material doped with magnesium atoms at a concentration of $1 \times 10^{18}$ cm$^{-3}$ or more.

4. The device according to claim 1, wherein the second p-type contact layer is formed to a thickness of 5 to 50 nm.

5. The device according to claim 1, wherein the first hole diffusion layer is formed to a thickness of 0.1 to 20 nm.

6. The device according to claim 1, wherein the second hole diffusion layer is formed to a thickness of 5 to 100 nm using a material having a composition of $In_zGa_{1-z}N$ ($0 \leq z \leq 0.05$) doped with magnesium atoms at a concentration of $1 \times 10^{17}$ cm$^{-3}$ to $1 \times 10^{18}$ cm$^{-3}$.

7. The device according to claim 1, wherein the light emitting active region is composed of a first barrier layer, a quantum well layer, and a second barrier layer.

8. The device according to claim 7, wherein the first barrier layer is formed to a thickness of 5 to 20 nm using a material having a composition of $In_zGa_{1-z}N$, which is the same as the second hole diffusion layer which is intentionally undoped or p-doped with magnesium atoms at a concentration of $1 \times 10^{17}$ cm$^{-3}$ or less.

9. The device according to claim 7, wherein the quantum well layer is formed to a thickness of 0.5 to 10 nm using a material having a composition of $In_xGa_{1-x}N$ which is intentionally undoped, and a bandgap is smaller than the first barrier layer.

10. The device according to claim 7, wherein the second barrier layer is formed to the same thickness using an $In_zGa_{1-z}N$ material having the same indium composition as the first barrier layer, and intentionally undoped or n-doped with silicon atoms at a concentration of $1 \times 10^{17}$ cm$^{-3}$ or less.

11. The device according to claim 1, wherein the second electron diffusion layer is formed to a thickness of 5 to 100 nm using a material having a composition of $In_zGa_{1-z}N$ doped with a silicon atom at a concentration of $1 \times 10^{17}$ cm$^{-3}$ to $1 \times 10^{18}$ cm$^{-3}$, and an indium composition z is within a growth technology error range and an indium composition of the second hole diffusion layer.

12. The device according to claim 1, wherein the first electron diffusion layer is formed to a thickness of 0.1 to 20 nm.

13. The device according to claim 1, wherein the second n-type contact layer is formed to a thickness of 5 to 50 nm.

14. The device according to claim 1, wherein the first n-type contact layer is formed to a thickness of 10 nm to 1 μm using GaN which is doped with silicon atoms at a concentration of $1 \times 10^{18}$ cm$^{-3}$ or more.

15. The device according to claim 1, further comprising:
an n-type metal electrode in contact with the first n-type contact layer; and
a p-type metal electrode in contact with the second hole diffusion layer, the first hole diffusion layer, the second p-type contact layer or the first p-type contact layer.

16. The device according to claim 1, further comprising:
an n-type metal electrode in contact with the first n-type contact layer; and
a p-type metal electrode in contact with a bottom of the first p-type contact layer from which the substrate and the buffer layer are removed.

17. The device according to claim 7, wherein the light emitting active region has 1 to 10 quantum wells, which is composed of the first barrier layer, the quantum well layer, and the second barrier layer.

* * * * *